(12) United States Patent
Tanaka et al.

(10) Patent No.: US 12,509,613 B2
(45) Date of Patent: Dec. 30, 2025

(54) RESIN COMPOSITION FOR PROVISIONAL FIXATION, SUPPORT TAPE FOR SUBSTRATE CONVEYANCE AND METHOD FOR PRODUCING ELECTRONIC DEVICE

(71) Applicant: Resonac Corporation, Tokyo (JP)

(72) Inventors: Mika Tanaka, Tokyo (JP); Shogo Sobue, Tokyo (JP); Shinji Irizawa, Tokyo (JP); Saeko Ogawa, Tokyo (JP)

( * ) Notice: Subject to any disclaimer, the term of this patent is extended or adjusted under 35 U.S.C. 154(b) by 693 days.

(21) Appl. No.: 17/771,017

(22) PCT Filed: Oct. 31, 2019

(86) PCT No.: PCT/JP2019/042884
§ 371 (c)(1),
(2) Date: Apr. 22, 2022

(87) PCT Pub. No.: WO2021/084708
PCT Pub. Date: May 6, 2021

(65) Prior Publication Data
US 2022/0363954 A1    Nov. 17, 2022

(51) Int. Cl.
*C09J 7/35* (2018.01)
*C09J 5/06* (2006.01)
*C09J 7/25* (2018.01)
*C09J 11/08* (2006.01)
(Continued)

(52) U.S. Cl.
CPC . *C09J 7/35* (2018.01); *C09J 5/06* (2013.01); *C09J 7/25* (2018.01); *C09J 11/08* (2013.01); *H01L 21/568* (2013.01); *H01L 21/6836* (2013.01); *C09J 2203/326* (2013.01); *C09J 2301/304* (2020.08); *C09J 2301/502* (2020.08); *C09J 2433/00* (2013.01);
(Continued)

(58) Field of Classification Search
None
See application file for complete search history.

(56) References Cited

U.S. PATENT DOCUMENTS 5,929,130 A * 7/1999 Suzuki .................. B29C 33/40
                                                          524/439
2014/0290994 A1* 10/2014 Kim ......................... C09C 1/36
                                                          174/258
(Continued)

FOREIGN PATENT DOCUMENTS

| CN | 104342047 | 2/2015 |
| CN | 108138012 | 6/2018 |
| CN | 108292590 | 7/2018 |

(Continued)

OTHER PUBLICATIONS

KR20180122460A_machine_translation (Year: 2018).*
(Continued)

*Primary Examiner* — Michael N Orlando
*Assistant Examiner* — Abhishek A Patwardhan
(74) *Attorney, Agent, or Firm* — SHIPWAY IP

(57) ABSTRACT

A resin composition for temporary fixing of a support for substrate conveyance to an organic substrate, the resin composition containing a thermoplastic resin, a thermosetting resin, and an inorganic filler. When the resin composition is formed into a film that is then heated for 30 minutes at 130° C. and for 2 hours at 170° C., the film obtains an elastic modulus of 350 to 550 MPa at 25° C.

20 Claims, 5 Drawing Sheets

(51) Int. Cl.
*H01L 21/56* (2006.01)
*H01L 21/683* (2006.01)

(52) U.S. Cl.
CPC ...... *C09J 2463/00* (2013.01); *C09J 2479/086* (2013.01); *C09J 2483/00* (2013.01)

(56) References Cited

U.S. PATENT DOCUMENTS

2017/0130006 A1* 5/2017 Saito .................. C08G 59/00
2018/0339497 A1* 11/2018 Makino ................ C08L 83/04

FOREIGN PATENT DOCUMENTS

| | | |
|---|---|---|
| JP | 2009-049253 | 3/2009 |
| JP | 4565804 | 10/2010 |
| JP | 2011-151125 | 8/2011 |
| JP | 4936667 | 5/2012 |
| JP | 2013-194103 | 9/2013 |
| JP | 2016-216572 | 12/2016 |
| JP | 2019-114599 | 7/2019 |
| JP | 2019-151696 | 9/2019 |
| KR | 20180122460 A * | 11/2018 |
| TW | 200633086 X | 9/2006 |

OTHER PUBLICATIONS

International Search Report dated Feb. 4, 2020 for PCT/JP2019/042884.
International Preliminary Report on Patentability with Written Opinion dated May 12, 2022 for PCT/JP2019/042884.

* cited by examiner (A)

(B)

RESIN COMPOSITION FOR PROVISIONAL FIXATION, SUPPORT TAPE FOR SUBSTRATE CONVEYANCE AND METHOD FOR PRODUCING ELECTRONIC DEVICE

CROSS-REFERENCE TO RELATED APPLICATION

This application is a 35 U.S.C. § 371 national phase application of PCT/JP2019/042884, filed on Oct. 31, 2019.

TECHNICAL FIELD

The present disclosure relates to a resin composition for temporary fixing, a support tape for substrate conveyance, and a method for producing an electronic device.

BACKGROUND ART

Along with multi-functionalization of electronic equipment such as smartphones and tablet PCs, stacked MCPs (Multi Chip Packages) having increased capacity by stacking semiconductor elements in multiple stages have been in widespread use. For the packaging of semiconductor elements, film-shaped adhesives are widely used as die-bonding adhesives. However, in the currently used method for connecting a semiconductor element using wire bonding, the operation of electronic equipment tends to be slow because the data processing speed is limited. Furthermore, since there is a growing need to suppress power consumption to a low level and to use electronic equipment for a longer time without charging, electric power saving is also required. From such a point of view, in recent years, electronic devices having a new structure in which semiconductor elements are connected to each other by means of through-electrodes instead of wire bonding have also been developed for the purpose of further speed improvement and electric power saving.

Although electronic devices having a new structure have been developed as such, there is still a demand for higher capacity, and development of a technology capable of stacking semiconductor elements in more stages regardless of the package structure is underway. However, in order to stack more semiconductor elements in a limited space, stabilized thickness reduction of semiconductor elements is indispensable.

For example, thickness reduction has been achieved by grinding a semiconductor wafer from the back surface side. In a grinding process at this time, it is mainstream to perform the grinding process in a state in which a tape known as so-called BG tape (back grinding tape) is stuck to a semiconductor to support the semiconductor wafer. However, the semiconductor wafer to be supplied to the grinding process has a circuit formed on the front surface side, and due to the influence of the circuit, warpage is likely to occur when thickness is reduced by grinding. Since a BG tape is made of a tape material that is easily deformable, the BG tape cannot sufficiently support a semiconductor wafer that has been reduced in thickness, and warpage is likely to occur in the semiconductor wafer. Thus, a method of fixing a wafer to a support by means of a tacky adhesive and subjecting the wafer to back surface grinding and conveyance has been proposed (see, for example, the following Patent Literatures 1 and 2).

CITATION LIST

Patent Literature

Patent Literature 1: Japanese Patent No. 4565804
Patent Literature 2: Japanese Patent No. 4936667

SUMMARY OF INVENTION

Technical Problem

However, in order to attempt thickness reduction of semiconductor elements, it has been investigated to use a thin organic substrate as the substrate, and specifically, development of a coreless substrate that does not use a core layer obtained by impregnating a glass cloth with a thermosetting resin has been in active progress. Since a coreless substrate does not have a core layer, it is possible to make the layer thickness of the substrate thin; however, on the other hand, since a highly elastic core layer is not present, it is difficult to secure rigidity of the substrate itself, and handleability in the production process for semiconductor elements becomes a problem to be solved.

Against such a background, the inventors of the present invention have investigated a method of pasting a support to a substrate together, with a temporary fixing material interposed therebetween and obtaining a laminated body to secure rigidity and to enhance handleability in the production process for a semiconductor element. However, in the above-described production process, since a reflow process is carried out in the state of being the above-described laminated body, there is a problem that peeling between the support and the substrate (between the support and the temporary fixing material or between the temporary fixing material and the substrate) during reflow, or foam that become the starting points of peeling are likely to occur. Furthermore, when the temporary fixing material and the support are torn off from the substrate at room temperature after a reflow process, there is a problem that peeling occurs between the temporary fixing material and the support, and the temporary fixing material is likely to remain on the substrate side.

The present disclosure was achieved in view of the above-described circumstances, and it is an object of the present disclosure to provide a resin composition for temporary fixing, which can achieve both the suppression of peeling between the support and the substrate during reflow and the peelability from the substrate after reflow, a support tape for substrate conveyance, and a method for producing an electronic device.

Solution to Problem

In order to attain the above-described object, the present disclosure provides a resin composition for temporary fixing intended for temporarily fixing a support for substrate conveyance to an organic substrate, the resin composition for temporary fixing containing a thermoplastic resin, a thermosetting resin, and an inorganic filler, wherein when the resin composition for temporary fixing is formed into a film shape, the film after being heated for 30 minutes at 130° C. and for 2 hours at 170° C. has an elastic modulus of 350 to 550 MPa at 25° C.

According to the resin composition for temporary fixing, when an organic substrate is temporarily fixed to a support for substrate conveyance, with a temporary fixing material formed from the resin composition for temporary fixing interposed therebetween, both the suppression of peeling between the support and the organic substrate during reflow and the peelability of the temporary fixing material from the organic substrate after reflow can be achieved. The reason for this is inferred to be as follows: since the resin composition for temporary fixing contains a thermoplastic resin, a thermosetting resin, and an inorganic filler, and at the same time, when the resin composition for temporary fixing is formed into a film shape, since the film after being heated as described above has an elastic modulus at 25° C. of 350 to 550 MPa, it is possible to form a temporary fixing material having excellent heat resistance and appropriate adhesive force to a support and an organic substrate, and it is possible to suppress the temporary fixing material from remaining on the organic substrate in a state of being at a room temperature after reflow, while suppressing the peeling between the support and the temporary fixing material and peeling between the temporary fixing material and the organic substrate during reflow, or the occurrence of foam that become the starting points of peeling.

Furthermore, when a laminated body is produced by pasting a support to an organic substrate, with a temporary fixing material formed from the above-described resin composition for temporary fixing interposed therebetween, the problem that bending occurs in the organic substrate during conveyance at the time of producing a semiconductor element to deteriorate handleability can be ameliorated. Further, with regard to the production process for a semiconductor element, even in a case where a reflow process is carried out in the state of the above-described laminated body, both the suppression of peeling between the support and the substrate during reflow and the peelability from the substrate after reflow can be achieved as mentioned above, by using the resin composition for temporary fixing.

The resin composition for temporary fixing may further contain a curing accelerator. Furthermore, the resin composition for temporary fixing may further contain a silicone compound.

The resin composition for temporary fixing is such that when the resin composition for temporary fixing is formed into a film shape, the 90° peel strength at 25° C. between the film after being heated for 30 minutes at 130° C. and for 2 hours at 170° C. and a substrate having a surface of solder resist AUS308 may be 30 to 150 N/m. As the 90° peel strength measured under the above-described conditions is in the above-described range, both the suppression of peeling between the support and the organic substrate during reflow and the peelability of the temporary fixing material from the organic substrate after reflow can be achieved at a higher level.

The resin composition for temporary fixing is such that when the resin composition for temporary fixing is formed into a film shape, the 90° peel strength at 25° C. between the film after being heated for 30 minutes at 130° C. and for 2 hours at 170° C. and a polyimide film may be 80 to 400 N/m. As the 90° peel strength measured under the above-described conditions is in the above-described range, both the suppression of peeling between the support and the organic substrate during reflow and the peelability of the temporary fixing material from the organic substrate after reflow can be achieved at a higher level.

With regard to the resin composition for temporary fixing, the inorganic filler may be an inorganic filler having an organic group on the surface. Furthermore, the organic group may include a vinyl group or an epoxy group. By using an inorganic filler having an organic group on the surface, the dispersibility in the resin composition for temporary fixing can be enhanced, and at the same time, the close adhesiveness of the resulting temporary fixing material to a support and an organic substrate and the heat resistance of the temporary fixing material can be enhanced. Furthermore, in a case where the organic group includes a vinyl group or an epoxy group, the above-described effect is more effectively provided, and at the same time, the adhesive force of the temporary fixing material thus obtainable to a support can be particularly increased.

The content of the inorganic filler in the resin composition for temporary fixing may be 20 to 100 parts by mass with respect to 100 parts by mass of the thermoplastic resin. By adjusting the content of the inorganic filler to the above-described range, both the suppression of peeling between the support and the substrate during reflow and the peelability of the temporary fixing material from the substrate after reflow can be achieved at a higher level.

The present disclosure also provides a support tape for substrate conveyance, the support tape including a support film for conveying an organic substrate; and a temporary fixing material layer provided on the support film for temporarily fixing the organic substrate and the support film, the temporary fixing material layer being formed using the resin composition for temporary fixing of the present disclosure. The support tape for substrate conveyance can enhance handleability of the organic substrate and can also achieve both the suppression of peeling between the support and the organic substrate during reflow and the peelability of the temporary fixing material from the organic substrate after reflow.

With regard to the support tape for substrate conveyance, the support film may be a polyethylene terephthalate film, a polybutylene terephthalate film, a polyethylene naphthalate film, a polypropylene film, a polyamide film, or a polyimide film.

With regard to the support tape for substrate conveyance, the 90° peel strength at 25° C. between the support film and the temporary fixing material layer after being heated for 30 minutes at 130° C. and for 2 hours at 170° C. may be 80 to 400 N/m. When the 90° peel strength measured under the above-described conditions is in the above-described range, both the suppression of peeling between the support and the organic substrate during reflow and the peelability of the temporary fixing material from the organic substrate after reflow can be achieved at a higher level.

The present disclosure also provides a method for producing an electronic device, the method including a first step of pasting a support to an organic substrate together, with a temporary fixing material interposed therebetween, to obtain a laminated body; a second step of heating the temporary fixing material of the laminated body; a third step of mounting a semiconductor chip on the organic substrate of the laminated body that has been subjected to the second step; a fourth step of sealing the semiconductor chip mounted on the organic substrate with a sealant; and a fifth step of peeling the support and the temporary fixing material from the organic substrate of the laminated body that has been subjected to the fourth step, wherein the temporary fixing material is formed using the above-described resin composition for temporary fixing of the present disclosure.

According to the above-described method for producing an electronic device, an electronic device including a semiconductor element that has been subjected to thickness reduction using an organic substrate can be produced with high productivity. That is, in the above-described production method, since the temporary fixing material is formed using the above-described resin composition for temporary fixing of the present disclosure, there can be provided effects such as that: (i) an organic substrate and a support can be stuck together in the first step, and the handleability of the thin organic substrate is enhanced (for example, conveyance of the thin organic substrate is facilitated); (ii) the temporary fixing material that has been subjected to the second step can sufficiently fix the organic substrate and the support in the third step and the fourth step, and packaging and sealing of a semiconductor chip can be efficiently achieved; and (iii) the temporary fixing material can be easily peeled off from the organic substrate without contaminating the substrate surface in the fifth step.

In the above-described production method, the thickness of the organic substrate may be 200 μm or less. Furthermore, the organic substrate may be a coreless substrate.

In the above-described production method, the support may be a polyethylene terephthalate film, a polybutylene terephthalate film, a polyethylene naphthalate film, a polypropylene film, a polyamide film, or a polyimide film.

In the first step, the support is in a tape form and may be continuously supplied. In this case, a thin organic substrate can be continuously conveyed, and enhancement of productivity can be attempted without making a large capital investment.

In the first step, the above-described laminated body can be obtained by using a support tape, which includes: a support film as the support, and a temporary fixing material layer provided on the support film and formed from the above-described temporary fixing material.

The method using such a support tape can make the variation of a temporary fixing material smaller as compared to the case where a liquid temporary fixing material is applied to form a temporary fixing material layer on an organic substrate or a support, and the semiconductor elements obtainable after processing are easily made uniform. Furthermore, it is easy to utilize the temporary fixing material without wasting.

With regard to the laminated body that has been subjected to the second step, the 90° peel strength at 25° C. between the organic substrate and the temporary fixing material may be 30 to 150 N/m. When the 90° peel strength is in the above-described range, both the suppression of peeling between the support and the organic substrate during reflow and the peelability of the temporary fixing material from the organic substrate after reflow can be achieved at a higher level.

With regard to the laminated body that has been subjected to the second step, the 90° peel strength at 25° C. between the support and the temporary fixing material may be 80 to 400 N/m. When the 90° peel strength is in the above-described range, both the suppression of peeling between the support and the organic substrate during reflow and the peelability of the temporary fixing material from the organic substrate after reflow can be achieved at a higher level.

Advantageous Effects of Invention

According to the present disclosure, a resin composition for temporary fixing that can achieve both the suppression of peeling between the support and the substrate during reflow and the peelability from the substrate after reflow, a support tape for substrate conveyance, and a method for producing an electronic device can be provided.

The resin composition for temporary fixing according to the present disclosure can sufficiently fix an organic substrate and a support for conveyance and can also easily peel the support from the organic substrate without contaminating the substrate surface. The support tape for substrate conveyance according to the present disclosure can enhance handleability of the organic substrate and can also be easily peeled off from the organic substrate without contaminating the substrate surface.

BRIEF DESCRIPTION OF DRAWINGS

FIG. 1(A) is a top view, while FIG. 1(B) is a schematic cross-sectional view taken along the line I-I in FIG. 1(A).

FIG. 2(A) is a top view, while FIG. 2(B) is a schematic cross-sectional view taken along the line II-II in FIG. 2(A).

DESCRIPTION OF EMBODIMENTS

Figure 1:
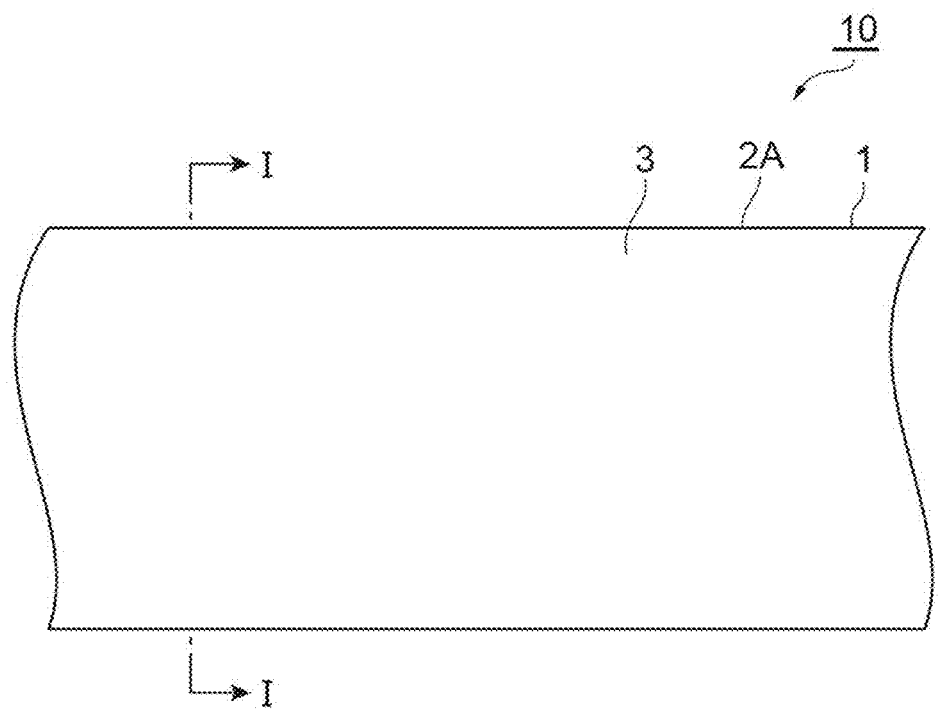
FIG. 1 is diagrams illustrating an embodiment of a support tape for substrate conveyance.
Figure 1:
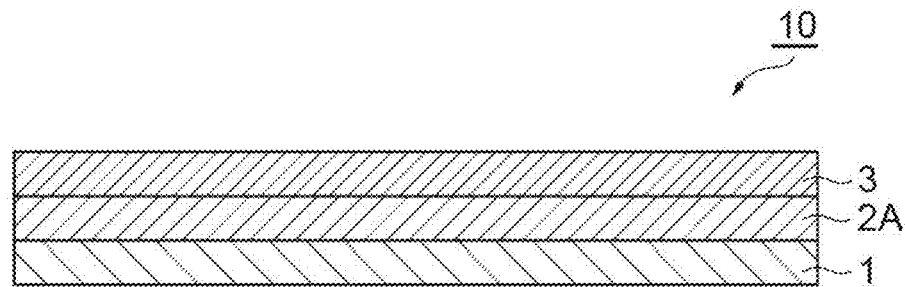

Hereinafter, embodiments for carrying out the present disclosure will be described in detail with reference to the drawings as necessary. However, the present disclosure is not limited to the following embodiments. According to the present specification, "(meth)acrylic acid" means acrylic acid or methacrylic acid, and "(meth)acrylate" means an acrylate or a methacrylate corresponding thereto. Regarding the expression "A or B", any one of A and B may be included, and it is also acceptable that both are included.

Furthermore, the term "layer" according to the present specification includes a structure having a shape that is formed over the entire surface when observed as a plan view, as well as a structure having a shape that is formed in a portion. Furthermore, the term "process" according to the present specification does not refer only to an independent process, and even in a case where a process is not clearly distinguishable from other processes, the process is included in the present term as long as the predetermined action of that process is achieved. Furthermore, a numerical value range indicated using the term "to" indicates a range including the numerical values described before and after the term "to" as the minimum value and the maximum value, respectively.

Furthermore, regarding the content of each component in a composition according to the present specification, when a plurality of substances corresponding to each component is present in the composition, unless particularly stated otherwise, the content means the total amount of the substances present in the composition. Furthermore, unless particularly stated otherwise, the exemplified materials may be used singly, or two or more kinds thereof may be used in combination.

Furthermore, with regard to numerical value ranges described as stages in the present specification, the upper limit value or lower limit value of a numerical value range of a certain stage may be replaced with the upper limit value or lower limit value of a numerical value range of another stage. Furthermore, with regard to a numerical value range described in the present specification, the upper limit value or lower limit value of the numerical value range may be replaced with a value shown in Examples.

[Resin Composition for Temporary Fixing]

A resin composition for temporary fixing according to the present embodiment includes a thermoplastic resin, a thermosetting resin, and an inorganic filler. The resin composition for temporary fixing may further include a curing agent, a curing accelerator, or another component, in addition to the above-described components.

The resin composition for temporary fixing according to the present embodiment can be used as a temporary fixing material for temporarily fixing a support for substrate conveyance to an organic substrate.

<Thermoplastic Resin>

Regarding the thermoplastic resin, a resin having thermoplasticity before the organic substrate and the support are stuck together, can be used without any particular limitations. According to the present embodiment, the thermoplastic resin may be a resin that forms a crosslinked structure by heating or the like. Examples of such a resin include a polymer having a crosslinkable functional group.

Examples of the polymer having a crosslinkable functional group include a thermoplastic polyimide resin, a (meth)acrylic copolymer having a crosslinkable functional group, a urethane resin-polyphenylene ether resin, a polyetherimide resin, a phenoxy resin, and a modified polyphenylene ether resin. Among these, a (meth)acrylic copolymer having a crosslinkable functional group is preferred.

Regarding the (meth)acrylic copolymer having a crosslinkable functional group, one obtainable by a polymerization method such as pearl polymerization or solution polymerization may be used, or a commercially available product may be used. A polymer having a crosslinkable functional group may have the crosslinkable functional group in the polymer chain or may have the crosslinkable functional group at the polymer chain ends. Specific examples of the crosslinkable functional group include an epoxy group, an alcoholic hydroxyl group, a phenolic hydroxyl group, and a carboxyl group. Among the crosslinkable functional groups, a carboxyl group is preferred. A carboxyl group can be introduced into the polymer chain by using acrylic acid.

The glass transition temperature (hereinafter, may be described as "Tg") of the thermoplastic resin is preferably −50° C. to 50° C., and more preferably −40° C. to 20° C. When the Tg is in such a range, more sufficient fluidity can be obtained while suppressing deterioration of handleability due to excessive increase in tack force, and since the elastic modulus after curing can be lowered, the peel strength can be more effectively suppressed from becoming excessively high.

The Tg is the midpoint glass transition temperature value obtainable when a thermoplastic resin is measured using differential scanning calorimetry (DSC, for example, "Thermo Plus 2" manufactured by Rigaku Corp.). Specifically, the Tg is the midpoint glass transition temperature obtained by measuring the change in the calorific value under the conditions of a rate of temperature increase of 10° C./min and a measurement temperature of −80° C. to 80° C. and calculating the temperature according to a method based on JIS K 7121:1987.

The weight average molecular weight of the thermoplastic resin is not particularly limited, and the weight average molecular weight is preferably 100,000 to 1,200,000, and more preferably 200,000 to 1,000,000. When the weight average molecular weight of the thermoplastic resin is in such a range, it is easy to secure film-forming properties and fluidity. The weight average molecular weight is a polystyrene-equivalent value obtained by gel permeation chromatography (GPC) using a calibration curve based on polystyrene standards.

Regarding the thermoplastic resin, one kind thereof may be used alone, or two or more kinds thereof may be used in combination.

The content of the thermoplastic resin in the resin composition for temporary fixing of the present embodiment can be set to 35 to 80 parts by mass with respect to 100 parts by mass of the total amount of the composition, and from the viewpoints of embeddability, peelability from the substrate, and adhesiveness to the support, the content is preferably 40 to 70 parts by mass, and more preferably 40 to 60 parts by mass.

<Thermosetting Resin>

Examples of the thermosetting resin include an epoxy resin, an acrylic resin, a silicone resin, a phenol resin, a thermosetting polyimide resin, a polyurethane resin, a melamine resin, and a urea resin.

The epoxy resin is not particularly limited as long as it has heat-resistant action after being cured. Regarding the epoxy resin, a bifunctional epoxy resin such as a bisphenol A type epoxy resin or a bisphenol F type epoxy resin; a novolac type epoxy resin such as a phenol novolac type epoxy resin or a cresol novolac type epoxy resin; or the like can be used. Furthermore, regarding the epoxy resin, generally known resins such as a polyfunctional epoxy resin, a glycidylamine type epoxy resin, a heterocyclic ring-containing epoxy resin, and an alicyclic epoxy resin can be applied.

Examples of the bisphenol A type epoxy resin include jER (registered trademark) series (EPIKOTE 807, EPIKOTE 815, EPIKOTE 825, EPIKOTE 827, EPIKOTE 828, EPIKOTE 834, EPIKOTE 1001, EPIKOTE 1004, EPIKOTE 1007, and EPIKOTE 1009; "EPIKOTE" is a registered trademark) manufactured by Mitsubishi Chemical Corp.; DER-330, DER-301, and DER-361 manufactured by the Dow Chemical Company; and YD8125 and YDF8170 manufactured by Nippon Steel & Sumikin Chemical Co., Ltd.

Examples of the phenol novolac type epoxy resin include EPIKOTE 152 and EPIKOTE 154 manufactured by Japan Epoxy Resins Co., Ltd.; EPPN-201 manufactured by Nippon Kayaku Co., Ltd.; and DEN-438 manufactured by the Dow Chemical Company.

Examples of the o-cresol novolac type epoxy resin include EOCN-102S, EOCN-103 S, EOCN-104S, EOCN-1012, EOCN-1025, and EOCN-1027 ("EOCN" is a registered trademark) manufactured by Nippon Kayaku Co., Ltd.; and YDCN701, YDCN702, YDCN703, and YDCN704 manufactured by Nippon Steel & Sumikin Chemical Co., Ltd.

Examples of the polyfunctional epoxy resin include Epon 1031S manufactured by Japan Epoxy Resins Co., Ltd.; ARALDITE 0163 manufactured by Huntsman Japan K.K.; DENACOL EX-611, EX-614, EX-614B, EX-622, EX-512, EX-521, EX-421, EX-411, and EX-321 manufactured by Nagase ChemteX Corp. ("ARALDITE" and "DENACOL" are registered trademarks).

Examples of the amine type epoxy resin include EPIKOTE 604 manufactured by Japan Epoxy Resins Co., Ltd.; YH-434 manufactured by Nippon Steel & Sumikin Chemical Co., Ltd.; TETRAD-X and TETRAD-C ("TETRAD" is a registered trademark) manufactured by Mitsubishi Gas Chemical Company, Inc.; and ELM-120 manufactured by Sumitomo Chemical Co., Ltd.

Examples of the heterocyclic ring-containing epoxy resin include ARALDITE PT810 manufactured by Ciba Specialty Chemicals, Inc.; and ERL4234, ERL4299, ERL4221, and ERL4206 manufactured by UCC Holdings Co., Ltd.

The above-mentioned epoxy resins may be used singly, or two or more kinds thereof may be used in combination.

In a case where an epoxy resin is used as the thermosetting resin, it is preferable to use an epoxy resin curing agent together with the epoxy resin.

Regarding the epoxy resin curing agent, a known curing agent that is conventionally used can be used. Examples of the epoxy resin curing agent include an amine, a polyamide, an acid anhydride, a polysulfide, boron trifluoride; a bisphenol having two or more phenolic hydroxyl groups in one molecule, such as bisphenol A, bisphenol F, or bisphenol S; and a phenol resin such as a phenol novolac resin, a bisphenol A novolac resin, or a cresol novolac resin. Particularly, from the viewpoint of having excellent electrolytic corrosion resistance during moisture absorption, the epoxy resin curing agent is preferably a phenol resin such as a phenol novolac resin, a bisphenol A novolac resin, or a cresol novolac resin.

Preferred examples among the phenol resins as the epoxy resin curing agent include products manufactured by DIC Corp., trade name: PHENOLITE LF2882, PHENOLITE LF2822, PHENOLITE TD-2090, PHENOLITE TD-2149, PHENOLITE VH-4150, and PHENOLITE VH4170; a product manufactured by Meiwa Plastic Industries, Ltd., trade name: H-1; products manufactured by Japan Epoxy Resins Co., Ltd., trade name: jER CURE MP402FPY, EPICURE YL6065, and EPICURE YLH129B65; and products manufactured by Mitsui Chemicals, Inc., trade name: MILEX XL, MILEX XLC, MILEX RN, MILEX RS, and MILEX VR ("PHENOLITE", "EPICURE", and "MILEX" are registered trademarks).

Regarding the thermosetting resin and the curing agent, one kind of each of them may be used alone, or two or more kinds thereof may be used in combination.

The content of the thermosetting resin in the resin composition for temporary fixing of the present embodiment is preferably 10 to 500 parts by mass, more preferably 15 to 300 parts by mass, and even more preferably 20 to 100 parts by mass, with respect to 100 parts by mass of the thermoplastic resin. When the content of the thermosetting resin is in the above-described range, the temporary fixing material can easily have sufficient low-temperature stickability, heat resistance, curability, and peelability in combination. When the content of the thermosetting resin is 10 parts by mass or more, stickability and heat resistance are enhanced, while at the same time, retainability of the organic substrate during the production of an electronic device is also enhanced, and there is a tendency that the components (for example, a semiconductor chip) constituting the electronic device are not likely to be damaged. On the other hand, when the content of the thermosetting resin is 500 parts by mass or less, the viscosity before curing is not likely to become excessively low, curing can occur in a relatively short time, and there is a tendency that it is easy to achieve both the retainability of the organic substrate and the support and the peelability between the organic substrate and the support.

<Inorganic Filler>

Examples of the inorganic filler include silica, alumina, boron nitride, titania, glass, iron oxide, and ceramic. The inorganic filler can be added for the purpose of imparting low thermal expansivity and low moisture absorbability to the resin composition for temporary fixing and a film-shaped temporary fixing material. Regarding the inorganic filler, one kind thereof may be used alone, or two or more kinds thereof may be used in combination.

It is preferable that the inorganic filler has an organic group on the surface. As the surface of the inorganic filler is modified by means of an organic group, the dispersibility of the resin composition for temporary fixing in an organic solvent at the time of preparing a coating liquid for forming a film-shaped temporary fixing material, and the close adhesiveness and heat resistance of the film-shaped temporary fixing material thus formed can be easily enhanced.

The inorganic filler having an organic group on the surface can be obtained by, for example, mixing a silane coupling agent represented by the following General Formula (B-1) with an inorganic filler, and stirring the mixture at a temperature of 30° C. or higher. Whether the surface of the inorganic filler is modified with an organic group can be checked by UV (ultraviolet radiation) measurement, IR (infrared radiation) measurement, XPS (X-ray photoelectron spectroscopy) measurement, and the like.

[Chemical formula 1]

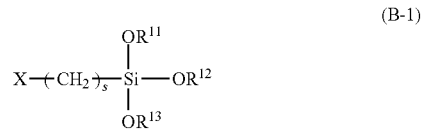

(B-1)

wherein in Formula (B-1), X represents an organic group selected from the group consisting of a phenyl group, a glycidoxy group, an acryloyl group, a methacryloyl group, a mercapto group, an amino group, a vinyl group, an isocyanate group, and a methacryloxy group; "s" represents an integer of 0 or 1 to 10; and $R^{11}$, $R^{12}$, and $R^{13}$ each independently represent an alkyl group having 1 to 10 carbon atoms.

Examples of the alkyl group having 1 to 10 carbon atoms include a methyl group, an ethyl group, a propyl group, a butyl group, a pentyl group, a hexyl group, a heptyl group, an octyl group, a nonyl group, a decyl group, an isopropyl group, and an isobutyl group. From the viewpoint that it is said to be easily available, the alkyl group having 1 to 10 carbon atoms is preferably a methyl group, an ethyl group, and a pentyl group.

From the viewpoint of heat resistance, X is preferably an amino group, a glycidoxy group, a mercapto group, and an isocyanate group, and more preferably a glycidoxy group and a mercapto group.

s in Formula (B-1) is preferably 0 to 5, and more preferably 0 to 4, from the viewpoint of suppressing fluidity of the temporary fixing material under a high temperature and enhancing heat resistance.

Preferred examples of the silane coupling agent include trimethoxyphenyl silane, dimethyldimethoxyphenylsilane, triethoxyphenylsilane, dimethoxymethylphenylsilane, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-isocyanatopropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propanamine, N,N'-bis(3-(trimethoxysilyl)propyl)ethylenediamine, polyoxyethylenepropyltrialkoxysilane, and polyethoxydimethylsiloxane. Among these, 3-aminopropyltriethoxysilane, 3-glycidoxypropyltrimethoxysilane, 3-isocyanatopropyltriethoxysilane, and 3-mercaptopropyltrimethoxysilane are preferred, and trimethoxyphenylsilane, 3-glycidoxypropyltrimethoxysilane, and 3-mercaptopropyltrimethoxysilane are more preferred.

Regarding the silane coupling agent, one kind thereof may be used alone, or two or more kinds thereof may be used in combination.

From the viewpoint of attempting a balance between the effect of enhancing heat resistance and storage stability, the amount of use of the coupling agent is preferably 0.01 to 50 parts by mass, and more preferably 0.05 parts by mass to 20 parts by mass, with respect to 100 parts by mass of the inorganic filler, and from the viewpoint of enhancing heat resistance, the amount of use is even more preferably 0.5 to 10 parts by mass.

The average particle size of the inorganic filler is preferably 1 to 1000 nm, more preferably 5 to 750 nm, and even more preferably 10 to 500 nm, from the viewpoint of the coatability at the time of producing the resin composition for temporary fixing into a film shape and from the viewpoint of achieving both the embeddability and the peelability of the temporary fixing material from the substrate after reflow at a higher level. The average particle size of the inorganic filler can be measured by, for example, a nanoparticle size distribution analyzer (manufactured by Shimadzu Corp., trade name: SALD-7500nano).

The content of the inorganic filler in the resin composition for temporary fixing of the present embodiment is preferably 300 parts by mass or less, more preferably 200 parts by mass or less, and even more preferably 100 parts by mass or less, with respect to 100 parts by mass of the thermoplastic resin, from the viewpoints of enhancing the handleability of the film-shaped temporary fixing material in the state of B-stage and enhancing the low thermal expansibility. Furthermore, the content of the inorganic filler is preferably 20 parts by mass or more, more preferably 25 parts by mass or more, even more preferably 30 parts by mass or more, and particularly preferably 35 parts by mass or more, with respect to 100 parts by mass of the thermoplastic resin, from the viewpoint of achieving both the suppression of peeling between the support and the substrate during reflow and the peelability of the temporary fixing material from the substrate after reflow at a higher level. When the content of the inorganic filler is adjusted to the above-described range, there is a tendency that desired functions can be imparted to the temporary fixing material while sufficiently securing adhesiveness to the organic substrate.

<Curing Accelerator>

Examples of the curing accelerator include an imidazole, a dicyandiamide derivative, a dicarboxylic acid dihydrazide, triphenylphosphine, tetraphenylphosphonium tetraphenylborate, 2-ethyl-4-methylimidazole tetraphenylborate, and 1,8-diazabicyclo[5,4,0]undecene-7-tetraphenylborate.

When the resin composition for temporary fixing of the present embodiment includes a (meth)acrylic copolymer having an epoxy group as the thermoplastic resin, it is preferable that the resin composition for temporary fixing further contains a curing accelerator that accelerates curing of the epoxy group carried by this copolymer. Examples of such a curing accelerator include an imidazole and 1,8-diazabicyclo[5,4,0]undecene-7-tetraphenylborate.

Regarding the curing accelerator, one kind thereof may be used alone, or two or more kinds thereof may be used in combination.

The content of the curing accelerator in the resin composition for temporary fixing of the present embodiment is preferably 0.01 to 5.0 parts by mass with respect to 100 parts by mass of the thermoplastic resin. When the content of the curing accelerator is 0.01 parts by mass or more, it becomes easy to sufficiently cure the resin composition for temporary fixing by the thermal history at the time of producing a semiconductor element, and the organic substrate and the support can be fixed more reliably. On the other hand, when the content of the curing accelerator is 5.0 parts by mass or less, the melt viscosity of the resin composition for temporary fixing does not increase excessively, and storage stability is easily secured.

<Other Components>

Examples of components other than the above-described components include a silicone compound, an organic filler, and a silane coupling agent.

As the silicone compound, a compound having a polysiloxane structure can be used without particular limitation. Examples include a silicone-modified resin, a straight silicone oil, a non-reactive modified silicone oil, and a reactive modified silicone oil.

As the resin composition for temporary fixing contains a silicone compound, when a film-shaped temporary fixing material formed from the resin composition for temporary fixing is peeled off from an organic substrate that has been subjected to predetermined processing, it is possible to easily peel the temporary fixing material even at a low temperature of 100° C. or lower, without using a solvent.

Examples of the silicone-modified resin include a silicone-modified alkyd resin. As the resin composition for temporary fixing contains a silicone-modified alkyd resin, when a film-shaped temporary fixing material formed from the resin composition for temporary fixing is peeled off from an organic substrate that has been subjected to predetermined processing, it is possible to peel the temporary fixing material more easily without using a solvent.

Examples of the modified silicone oil include a polyether-modified silicone, an alkyl-modified silicone, and an epoxy-modified silicone.

Examples of commercially available products of the above-mentioned silicone compound include trade name: SH3773M, L-7001, SH-550, and SH-710 manufactured by Dow Corning Toray Co., Ltd.; trade name: X-22-163, KF-105, X-22-163B, and X-22-163C manufactured by Shin-Etsu Chemical Co., Ltd.; and trade name: BYK-UV3500 manufactured by BYK-Chemie GmbH.

Regarding the silicone compound, one kind thereof may be used alone, or two or more kinds thereof may be used in combination.

The content of the silicone compound in the resin composition for temporary fixing is preferably 0 to 100 parts by mass, and more preferably 0.01 to 80 parts by mass, with respect to 100 parts by mass of the thermoplastic resin. When the content of the silicone compound is in the above-described range, it is possible to achieve both the adhesiveness to an organic substrate during processing and the peelability from an organic substrate after processing at a higher level.

Furthermore, from the viewpoint of suppressing contamination of the organic substrate, the resin composition for temporary fixing of the present embodiment may not include a silicone compound or may have a content of a silicone compound of 10% by mass or less based on the total amount of the resin composition for temporary fixing. According to the resin composition for temporary fixing of the present embodiment, since peelability of the temporary fixing material from the organic substrate can be secured even if the content of the silicone compound is 10% by mass or less, both the suppression of contamination of the organic substrate and the peelability of the temporary fixing material from the organic substrate can be achieved.

Examples of the organic filler include carbon, a rubber-based filler, silicone-based microparticles, polyamide microparticles, and polyimide microparticles.

The content of the organic filler in the resin composition for temporary fixing of the present embodiment is preferably 300 parts by mass or less, more preferably 200 parts by mass or less, and even more preferably 100 parts by mass or less, with respect to 100 parts by mass of the thermoplastic resin. The lower limit of the content of the organic filler is not particularly limited and may be 5 parts by mass or more with respect to 100 parts by mass of the thermoplastic resin. When the content of the organic filler is adjusted to the above-described range, there is a tendency that desired functions can be imparted to the temporary fixing material while sufficiently securing adhesiveness to the organic substrate.

The resin composition for temporary fixing according to the present embodiment is such that when formed into a film shape, the resin composition for temporary fixing has an elastic modulus of 350 to 550 MPa at 25° C. after being heated for 30 minutes at 130° C. and for 2 hours at 170° C.

The elastic modulus after being heated is measured by the following procedure. First, four sheets of a film of the resin composition for temporary fixing having a thickness of 60 μm are laminated at 80° C. to produce a film having a thickness of 240 μm. This is heated under predetermined conditions (for example, heated for 30 minutes in an oven at 130° C. and for 2 hours at 170° C.) and then is cut out into a size of 4 mm width and 33 mm length in the thickness direction. The cut film is mounted on a dynamic viscoelasticity apparatus (trade name: Rheogel-E4000, manufactured by UMB), a tensile load is applied thereto, the elastic modulus is measured at a frequency of 10 Hz and a rate of temperature increase of 5° C./min, and the measured value at 25° C. is recorded.

The above-described elastic modulus at 25° C. after being heated is preferably 360 to 520 MPa, more preferably 370 to 500 MPa, and even more preferably 442 to 490 MPa, from the viewpoint of achieving both the suppression of peeling between the support and the substrate during reflow and the peelability of the temporary fixing material from the substrate after reflow at a higher level.

The elastic modulus at 25° C. after being heated can be adjusted by means of, for example, the type and blending amount of the inorganic filler, the type and blending amount of the thermoplastic resin, the type and blending amount of the thermosetting resin, and the like.

The resin composition for temporary fixing according to the present embodiment is such that after the resin composition for temporary fixing is formed into a film shape, laminated on a substrate having a surface of solder resist AUS308, and heated for 30 minutes at 130° C. and for 2 hours at 170° C., the 90° peel strength at 25° C. between the film and the substrate may be 30 to 150 N/m, 40 to 100 N/m, or 40 to 80 N/m. When the 90° peel strength is in the above-described range, the organic substrate and the temporary fixing material are not likely to be peeled off, packaging and sealing of a semiconductor chip on an organic substrate reinforced with a support are more easily achieved, and both the suppression of peeling between the support and the organic substrate during reflow and the peelability of the temporary fixing material from the organic substrate after reflow can be achieved at a higher level.

The 90° peel strength is measured as follows. A substrate (material: glass epoxy substrate, substrate thickness: 1000 μm) having a surface of solder resist "PSR-4000 AUS308" (manufactured by Taiyo Ink Manufacturing Co., Ltd., trade name) is placed on a stage of a roll laminator (manufactured by Taisei Laminator Co., Ltd., FAST LAMINATOR VA-400III), and a resin composition for temporary fixing that has been formed into a film shape having a thickness of 60 μm is placed on the substrate so as to be pasted to the substrate. This is stuck under the conditions of a speed of 0.4 m/min, a temperature of 80° C., and a pressure of 0.2 MPa, and a sample for measurement is obtained. The obtained sample for measurement is heated under predetermined heating conditions (for example, heated for 30 minutes at 130° C. and for 2 hours at 170° C.) and then cut out into a size of 10 mm in width. This is subjected to a peel test at a rate of 300 mm/min using a peel testing machine set to have a peel angle of 90°, and the peel strength at that time is designated as 90° peel strength.

Furthermore, the resin composition for temporary fixing according to the present embodiment is such that when the resin composition for temporary fixing is formed into a film shape and laminated on a polyimide film (manufactured by DuPont-Toray Co., Ltd., trade name: 100EN, thickness 25 μm) as a support, and the laminated body is heated for 30 minutes at 130° C. and for 2 hours at 170° C., the 90° peel strength at 25° C. between the film and the support may be 80 N/m or higher, 100 N/m or higher, or 120 N/m or higher and may be 500 N/m or lower, 400 N/m or lower, or 300 N/m or lower. When the 90° peel strength is in the above-described range, both the suppression of peeling between the support and the organic substrate during reflow and the peelability of the temporary fixing material from the organic substrate after reflow can be achieved at a higher level.

The resin composition for temporary fixing of the present embodiment can form a film-shaped temporary fixing material. In this case, it becomes easier to control the film thickness of the temporary fixing material, and the thickness fluctuation in a laminated body of the organic substrate, the temporary fixing material, and the support can be reduced. Furthermore, the film-shaped temporary fixing material can be stuck onto an organic substrate or a support by a convenient method such as lamination and has excellent workability.

The thickness of the film-shaped temporary fixing material is not particularly limited, and from the viewpoint of sufficiently fixing the organic substrate and a support for conveyance, the thickness is preferably 10 to 350 μm. When the thickness is 10 μm or more, the thickness fluctuation during application is reduced, and since the thickness is sufficient, the strength of the temporary fixing material or a cured product of the temporary fixing material is improved so that the organic substrate and the support for conveyance can be more sufficiently fixed. When the thickness is 350 μm or less, thickness fluctuation of the temporary fixing material is not likely to occur, it is easy to reduce the amount of residual solvent in the temporary fixing material by sufficiently drying, and foam generated when heating a cured product of the temporary fixing material can be further reduced.

[Support Tape for Substrate Conveyance]

A support tape for substrate conveyance of the present embodiment includes a support film for conveying an organic substrate; and a temporary fixing material layer provided on the support film for temporarily fixing the organic substrate and the support film.

The temporary fixing material layer contains a thermoplastic resin, a thermosetting resin, and an inorganic filler, and the elastic modulus of the temporary fixing material after being heated for 30 minutes at 130° C. and for 2 hours at 170° C. may be 350 to 550 MPa at 25° C. Such a temporary fixing material layer can be formed from the above-mentioned resin composition for temporary fixing of the present embodiment.

FIG. 1 is a diagram showing an embodiment of the support tape for substrate conveyance, and FIG. 1(A) is a top view, while FIG. 1(B) is a schematic cross-sectional view taken along the line I-I of FIG. 1(A). A support tape for substrate conveyance 10 shown in these diagrams includes a support film 1; a temporary fixing material layer 2A formed from the resin composition for temporary fixing of the present embodiment; and a protective film 3, in this order.

The support film 1 is not particularly limited as long as it can convey an organic substrate, and examples thereof include a polyethylene terephthalate film, a polybutylene terephthalate film, a polyethylene naphthalate film, a polyethylene film, a polypropylene film, a polyamide film, and a polyimide film. Among these, from the viewpoint of having excellent flexibility and toughness, a polyethylene terephthalate film, a polybutylene terephthalate film, a polyethylene naphthalate film, a polypropylene film, a polyamide film, and a polyimide film are preferred, and from the viewpoints of heat resistance and strength, a polyimide film is more preferred.

The thickness of the support film 1 can be appropriately set according to the intended strength and flexibility, and the thickness is preferably 3 to 350 μm. When the thickness is 3 μm or more, sufficient film strength tends to be obtained, and when the thickness is 350 μm or less, sufficient flexibility tends to be obtained. From such a viewpoint, the thickness of the support film 1 is more preferably 5 to 200 μm, and even more preferably 7 to 150 μm.

The protective film 3 is not particularly limited, and examples include a polyethylene terephthalate film, a polybutylene terephthalate film, a polyethylene naphthalate film, a polyethylene film, and a polypropylene film. Regarding the protective film 3, from the viewpoints of flexibility and toughness, a polyethylene terephthalate film, a polyethylene film, and a polypropylene film are preferred. Furthermore, from the viewpoint of enhancing the peelability from the temporary fixing material layer, it is preferable to use a film subjected to a release treatment using a silicone-based compound, a fluorine-based compound, or the like, as the protective film 3.

The thickness of the protective film 3 can be appropriately set according to the intended strength and flexibility, and for example, the thickness is preferably 10 to 350 μm. When the thickness is 10 μm or more, sufficient film strength tends to be obtained, and when the thickness is 350 μm or less, sufficient flexibility tends to be obtained. From such a viewpoint, the thickness of the protective film 3 is more preferably 15 to 200 μm, and even more preferably 20 to 150 μm.

The temporary fixing material layer 2A can be formed by a method of mixing and kneading the various components constituting the above-mentioned resin composition for temporary fixing of the present embodiment in an organic solvent to prepare a varnish, applying the produced varnish on the support film 1, and drying the varnish.

The organic solvent is not particularly limited and can be determined by considering the volatility and the like during film formation from the boiling point. Specifically, from the viewpoint of making the curing of the film during film formation difficult to proceed, a solvent having a relatively low boiling point, such as methanol, ethanol, 2-methoxyethanol, 2-ethoxyethanol, 2-butoxyethanol, methyl ethyl ketone, acetone, methyl isobutyl ketone, toluene, or xylene, is preferred. Furthermore, for the purpose of enhancing the film-forming properties and the like, for example, it is preferable to use a solvent having a relatively high boiling point, such as dimethylacetamide, dimethylformamide, N-methylpyrrolidone, or cyclohexanone. These solvents may be used singly, or two or more kinds thereof may be used in combination. The solid content concentration in the varnish is preferably 10% to 80% by mass.

Mixing and kneading can be carried out by using dispersing machines such as a conventional stirrer, a Raikai mixer, a three-roll, and a ball mill and appropriately combining these. Drying is not particularly limited as long as it is performed under the conditions in which the organic solvent used is sufficiently volatilized, and drying can be carried out usually by heating at 60° C. to 200° C. for 0.1 to 90 minutes.

The support tape for substrate conveyance 10 can be obtained by forming the temporary fixing material layer 2A on the support film 1 and then pasting the protective film 3 onto the temporary fixing material layer 2A.

The support tape for substrate conveyance 10 can be easily stored by, for example, winding into a roll shape. Furthermore, the roll-shaped support tape for substrate conveyance 10 can also be stored in a state of being cut into an adequate size.

Figure 2:
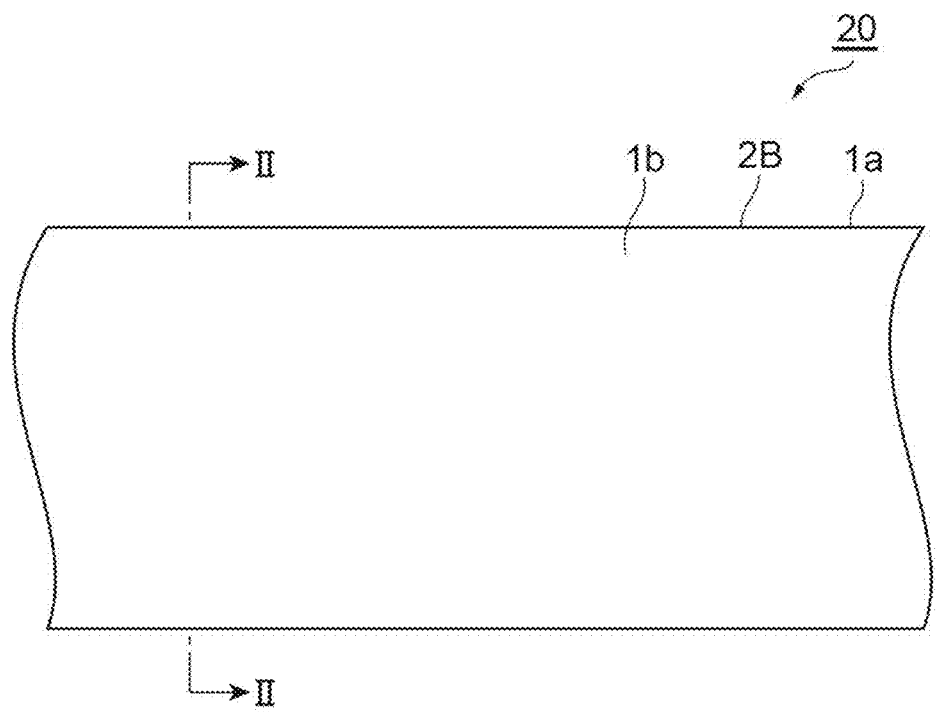
FIG. 2 is diagrams illustrating another embodiment of the support tape for substrate conveyance.
Figure 2:
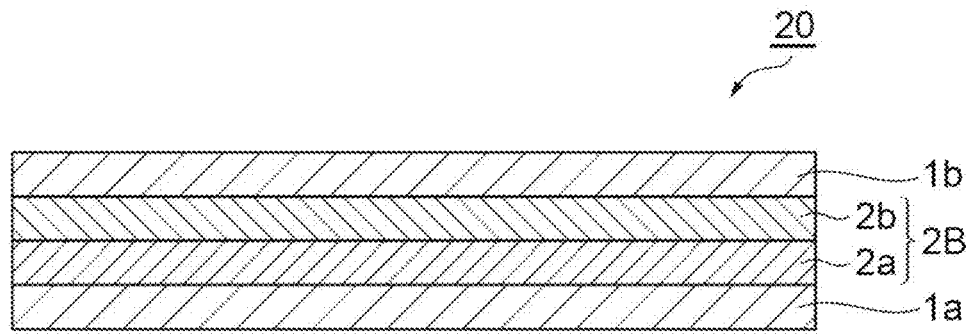

FIG. 2 is a diagram showing another embodiment of the support tape for substrate conveyance, and FIG. 2(A) is a top view, while FIG. 2(B) is a schematic cross-sectional view taken along the line II-II of FIG. 2(A). A support tape for substrate conveyance 20 shown in these diagrams includes a support film 1a; the temporary fixing material layer 2B composed of a first resin layer 2a and a second resin layer 2b; and a support film 1b, in this order.

The first resin layer 2a and the second resin layer 2b may be composed of the same composition or may be composed of compositions different from each other. In a case where the first resin layer 2a and the second resin layer 2b are composed of different compositions, for example, when the second resin layer 2b is assumed to be on the side in contact with the organic substrate, the support film 1a can be used as a support film for conveyance. In this case, by having the second resin layer 2b composed of the resin composition for temporary fixing of the present embodiment, it is possible to achieve both sufficient fixation of the organic substrate and the support film for conveyance and easy peeling of the support film for conveyance from the organic substrate. The first resin layer 2a can be designed to have excellent adhesiveness to the support film 1a, which is the support film for conveyance.

The temporary fixing material layer 2B can be formed by mixing and kneading the above-mentioned components in an organic solvent to prepare a varnish, producing a laminated body by applying and then drying this on the support film 1a, producing another laminated body by applying and then drying a varnish identical to the above-described one or a varnish prepared separately on the support film 1b, and pasting the laminated bodies together. In the case of forming the first resin layer 2a and the second resin layer 2b with the same varnish, there is an advantage that even when a relatively thick temporary fixing material layer is formed, the residual amount of the organic solvent can be easily reduced sufficiently. The first resin layer 2a and the second resin layer 2b may be integrated to form a single-layer structure or may maintain a two-layer structure with an interface existing between the two layers.

[Method for Producing Electronic Device]

A method for producing an electronic device using the resin composition for temporary fixing according to the present embodiment can include the following roughly divided five steps:

(a) a first step of pasting a support to an organic substrate, with a temporary fixing material interposed therebetween, to obtain a laminated body;

(b) a second step of heating the temporary fixing material of the laminated body;

(c) a third step of mounting a semiconductor chip on the organic substrate of the laminated body that has been subjected to the second step;

(d) a fourth step of sealing the semiconductor chip mounted on the organic substrate with a sealant; and (e) a fifth step of peeling the support and the temporary fixing material from the organic substrate of the laminated body that has been subjected to the fourth step.

Figure 3:
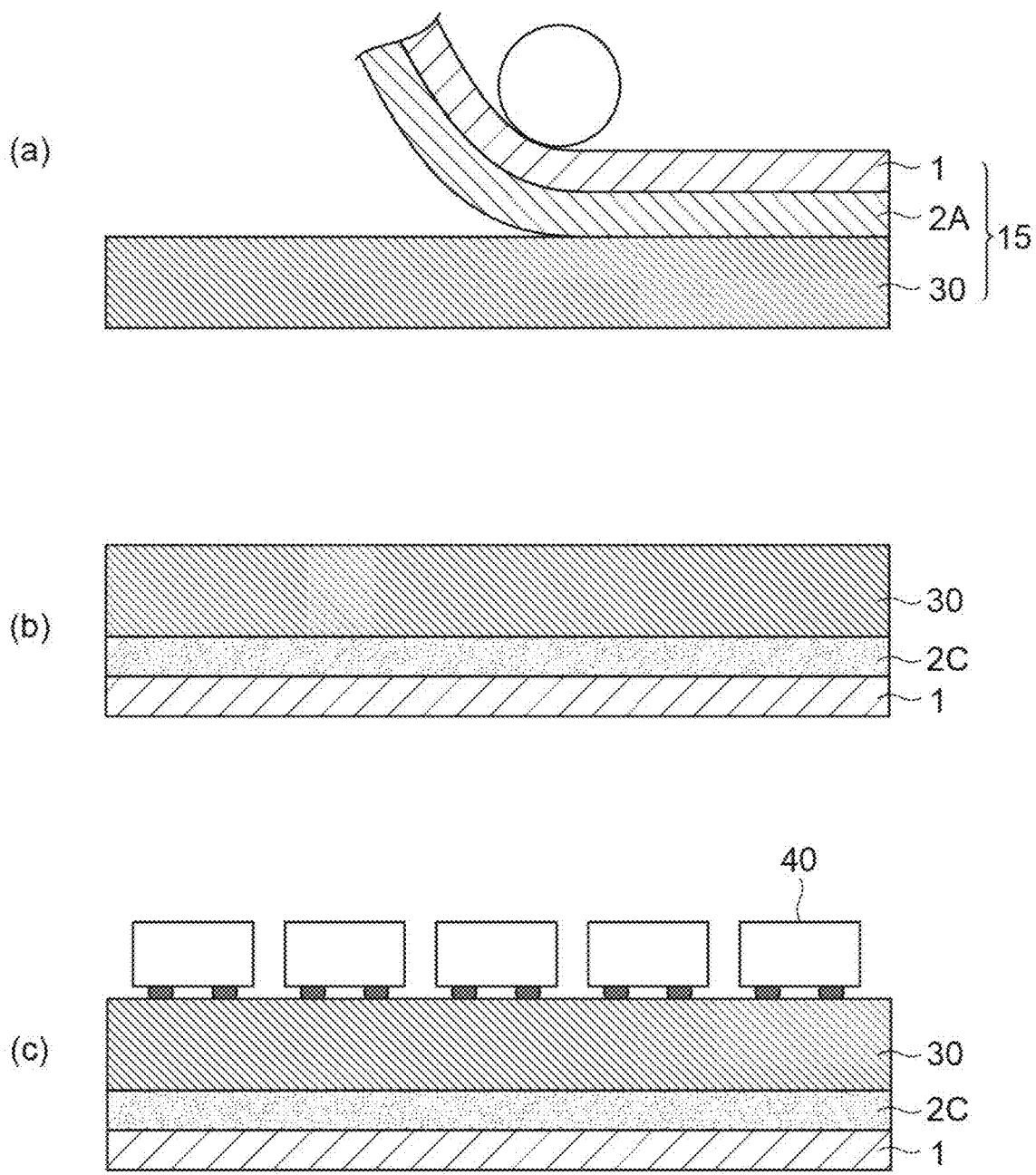
FIG. 3(a) to FIG. 3(c) are schematic cross-sectional views for describing an embodiment of a method for producing an electronic device.
Figure 4:
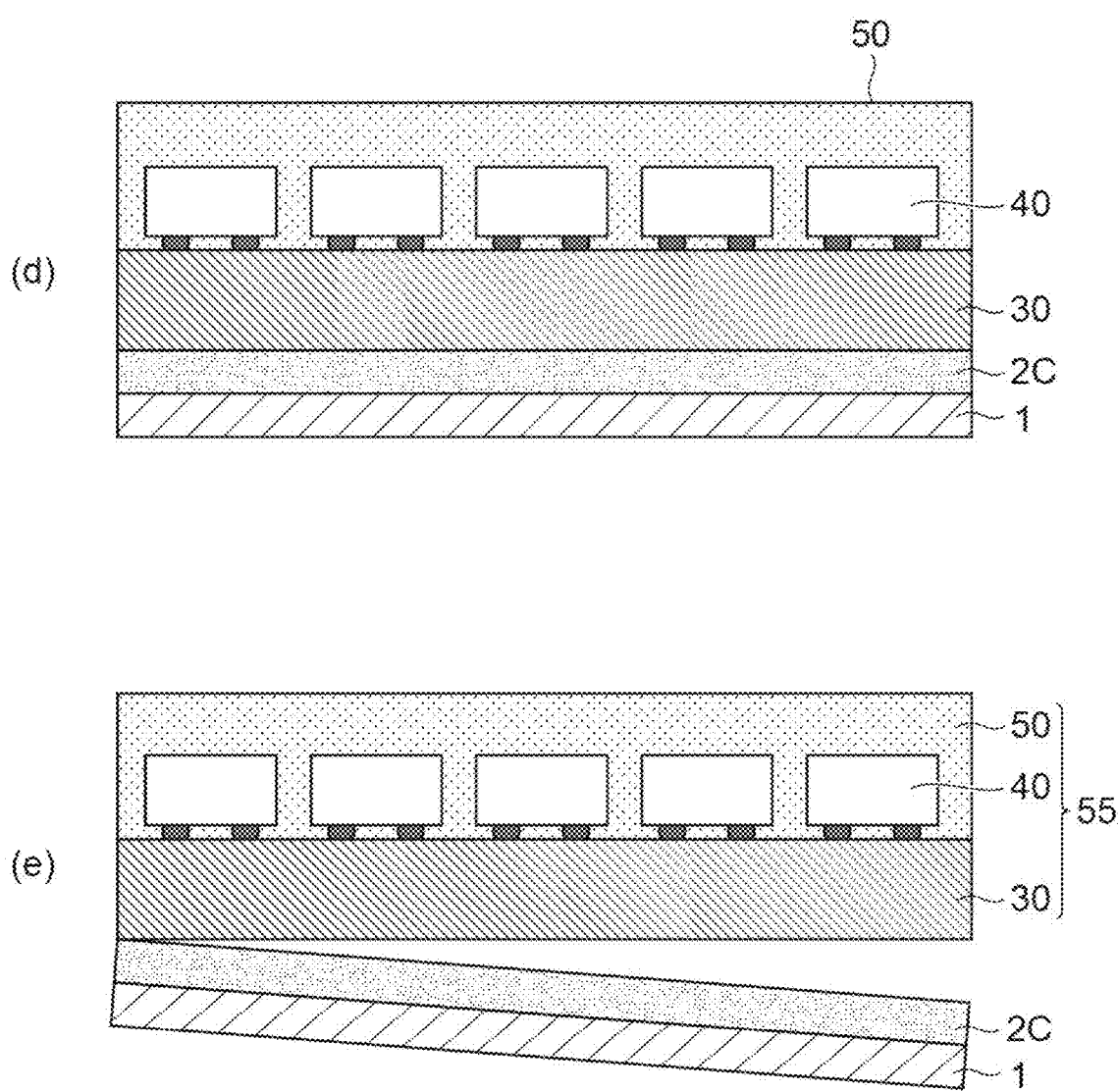
FIG. 4(d) and FIG. 4(e) are schematic cross-sectional views for describing an embodiment of the method for producing an electronic device.
Figure 5:
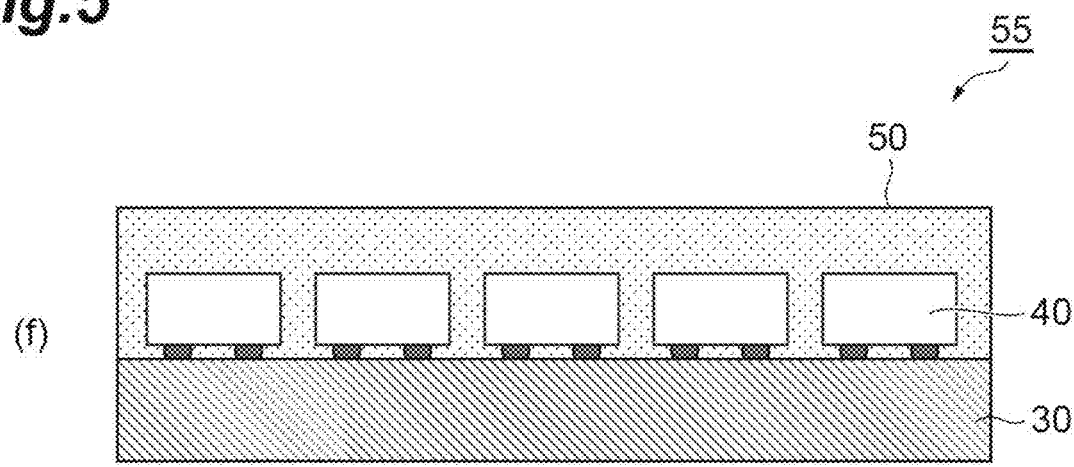
FIG. 5(f) to FIG. 5(h) are schematic cross-sectional views for describing an embodiment of the method for producing an electronic device.
Figure 5:
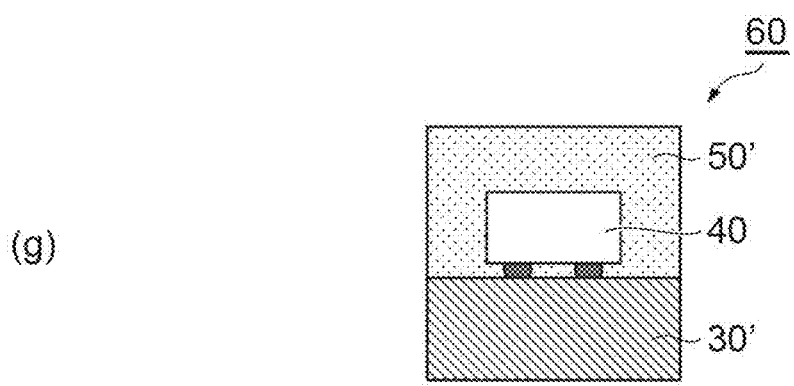
Figure 5:
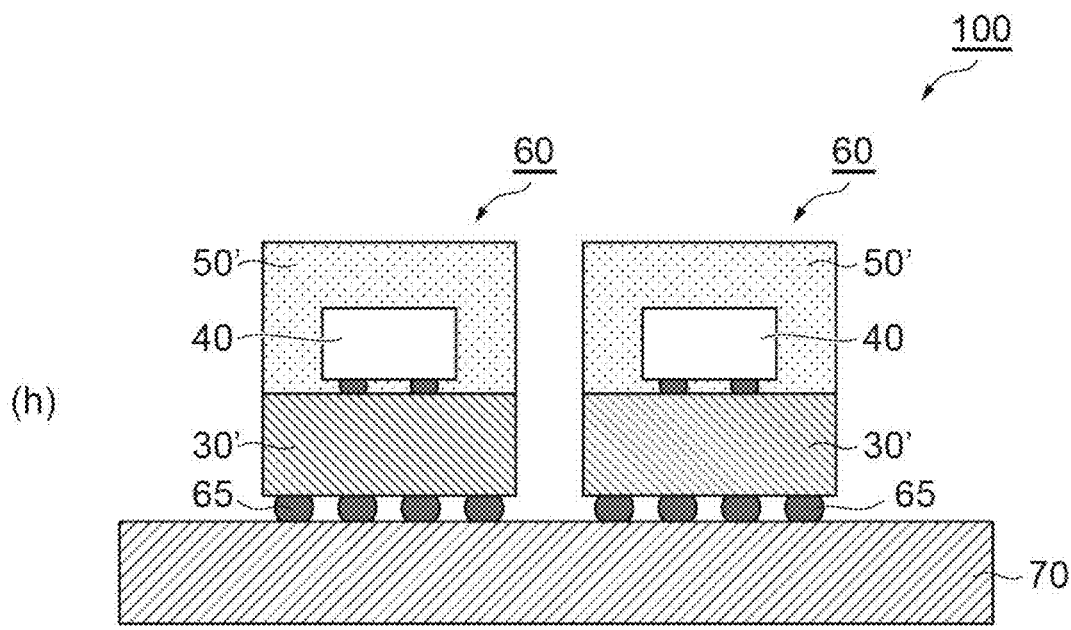

FIG. 3, FIG. 4, and FIG. 5 are schematic cross-sectional views for describing an embodiment of the method for producing an electronic device. Incidentally, in FIG. 3, FIG. 4, and FIG. 5, the case in which the temporary fixing material (temporary fixing material layer) is the temporary fixing material layer 2A of the support tape for substrate conveyance 10 shown in FIG. 1(B) is illustrated; however, the configuration of the temporary fixing material is not limited to this.

<(a) First Step>

In the first step, a laminated body 15 is obtained by pasting a support film 1 to an organic substrate 30, with the temporary fixing material layer 2A interposed therebetween (FIG. 3(a)).

As the organic substrate 30, for example, a substrate having a thickness of 10 to 1000 μm can be used. From the viewpoint of reducing the thickness of a semiconductor element or an electronic device, the thickness of the organic substrate 30 may be 200 μm or less or may be 100 μm or less. From the viewpoint of maintaining the strength of the package and reducing warpage, the thickness of the organic substrate 30 may be 30 μm or more and may be 50 μm or more.

The organic substrate 30 may be a coreless substrate. Examples of the material of the coreless substrate include a buildup material of an epoxy resin composition or the like. The organic substrate 30 may have a composition including an acrylate-based resin on the surface.

As shown in FIG. 3(a), in the case of obtaining the laminated body 15 using the support tape for substrate conveyance 10, the organic substrate 30 and the support film 1 can be laminated, with the temporary fixing material layer 2A interposed therebetween, using a roll laminator. When the support tape for substrate conveyance 10 includes a protective film 3, the protective film 3 may be torn off before lamination, and the temporary fixing material layer 2A and the support film 1 may be laminated while tearing off the protective film 3.

Regarding the roll laminator, for example, a roll laminator VA400III (trade name) manufactured by Taisei Laminator Co., Ltd. may be mentioned. In the case of using this apparatus, the organic substrate 30 and the support film 1 can be stuck together, with the temporary fixing material layer 2A interposed therebetween, at a pressure of 0.1 MPa to 1.0 MPa, a temperature of 40° C. to 150° C., and a velocity of 0.1 to 1.0 m/min.

In the present embodiment, the support tape for substrate conveyance 10, which is in a tape form, can be continuously supplied. In this case, the organic substrate 30 reinforced by the support film 1 in a tape form can be continuously conveyed, and an enhancement of the yield, shortening of the production time, and the like can be attempted.

A vacuum laminator can also be used instead of a roll laminator.

Examples of the vacuum laminator include a vacuum laminator LM-50X50-S (trade name) manufactured by NPC, Inc., and a vacuum laminator V130 (trade name) manufactured by Nichigo Morton Co., Ltd. Regarding the lamination conditions, the organic substrate 30 and the support film 1 can be stuck together, with the temporary fixing material layer 2A interposed therebetween, at an atmospheric pressure of 1 hPa or lower, a pressure-bonding temperature of 40° C. to 150° C. (preferably 60° C. to 120° C.), a lamination pressure of 0.01 to 0.5 MPa (preferably 0.1 to 0.5 MPa), and a retention time of 1 second to 600 seconds (preferably 30 seconds to 300 seconds).

<(b) Second Step>

In the second step, the temporary fixing material layer 2A of the laminated body 15 is heated. As a result of this step, the organic substrate 30 and the support film 1 are sufficiently fixed by a cured temporary fixing material layer 2C (FIG. 3(b)), and the handleability of the organic substrate is enhanced.

Heating can be carried out by, for example, using an explosion-proof dryer. Regarding the heating conditions, curing at 100° C. to 200° C. for 10 to 300 minutes (more preferably 20 to 210 minutes) is preferred. When the temperature is 100° C. or higher, the temporary fixing material is sufficiently cured so that problems are not likely to occur in the subsequent step, and when the temperature is 200° C. or lower, outgases are not likely to be generated during curing of the temporary fixing material, and peeling of the temporary fixing material can be further suppressed. Furthermore, when the heating time is 10 minutes or longer, problems are not likely to occur in the subsequent steps, and when the heating time is 300 minutes or less, the operation efficiency is not likely to be deteriorated. The temporary fixing material layer 2C in FIG. 3(b) represents a cured body of the temporary fixing material layer 2A.

<(c) Third Step>

In the third step, a semiconductor chip is mounted on the organic substrate of the laminated body that has been subjected to the second step. For example, a semiconductor chip 40 can be packaged on the organic substrate 30 by using a flip-chip bonder (FIG. 3(c)). Examples of the packaging apparatus include FC3000L (trade name) manufactured by Toray Engineering Co., Ltd., and the packaging conditions can be optionally selected in accordance with the desired organic substrate and the semiconductor chip.

In the third step, a semiconductor chip may be packaged on the organic substrate by carrying out a reflow process. The reflow process can be carried out by heating the laminated body with the semiconductor chip mounted thereon at a temperature at which solder melts. The heating temperature is adjusted according to the type of the solder; however, the heating temperature is, for example, 190° C. to 280° C., and preferably 220° C. to 270° C. When the resin composition for temporary fixing of the present embodiment is used, even in a case where a reflow process is carried out at the above-described temperature, the organic substrate 30 and the support film 1 stuck together, with the temporary fixing material layer 2A interposed therebetween, can be suppressed from being peeled off during the reflow process, and at the same time, the support film 1 can be easily peeled off from the organic substrate 30 at room temperature after the reflow process, while suppressing remaining of the temporary fixing material layer 2A on the organic substrate 30.

<(d) Fourth Step>

In the fourth step, as shown in FIG. 4(*d*), the semiconductor chip 40 mounted on the organic substrate 30 is sealed with a sealant 50. Examples of the sealing apparatus include FFT1030G (trade name) manufactured by TOWA Corp., and the sealing conditions can be optionally selected according to the desired organic substrate, semiconductor chip, and sealant. Furthermore, the curing conditions for the sealant after sealing can be optionally selected according to the type of the sealant.

<(e) Fifth Step>

In the fifth step, as shown in FIG. 4(*e*), the support film 1 and the temporary fixing material layer 2C are peeled off from the organic substrate 30 of the laminated body that has been subjected to the fourth step. Examples of the method for peeling include a method of horizontally fixing any one of a semiconductor chip-packaged substrate where a semiconductor chip is mounted on an organic substrate and sealed, or the support film, and lifting the other one at a certain angle; and a method of attaching a protective film on the sealed surface of the semiconductor chip-packaged substrate, and peeling off the semiconductor chip-packaged substrate and the protective film from the support film by a peeling method.

These methods for peeling are usually carried out at room temperature; however, these methods may also be carried out at a temperature of about 40° C. to 100° C.

According to the present embodiment, when the temporary fixing material partially remains on the semiconductor chip-packaged substrate, a cleaning process for removing this can be provided. The removal of the temporary fixing material can be carried out by, for example, cleaning the semiconductor chip-packaged substrate.

The cleaning liquid is not particularly limited as long as it is a cleaning liquid capable of removing the partially remaining temporary fixing material. Examples of such a cleaning liquid include the above-described organic solvents that can be used for diluting the resin composition for temporary fixing. These organic solvents can be used singly, or two or more kinds thereof may be used in combination.

Furthermore, in a case where it is difficult to remove the remaining temporary fixing material, a base or an acid may be added to the organic solvent. Examples of the base that can be used include amines such as ethanolamine, diethanolamine, triethanolamine, triethylamine, and ammonia; and ammonium salts such as tetramethylammonium hydroxide. Examples of the acid that can be used include organic acids such as acetic acid, oxalic acid, benzenesulfonic acid, and dodecylbenzenesulfonic acid. The amount of addition is preferably 0.01% to 10% by mass as the concentration in the cleaning liquid. Furthermore, existing surfactants may also be added to the cleaning liquid in order to enhance the removability of the residue.

The method for cleaning is not particularly limited, and examples include a method of performing cleaning with a paddle using the above-described cleaning liquid, a method of cleaning by spraying, and a method of immersing in a cleaning liquid tank. The temperature is suitably 10° C. to 80° C., and preferably 15° C. to 65° C., finally washing with water or washing with alcohol is performed, and a drying treatment is performed to obtain a semiconductor chip-packaged substrate.

Incidentally, as described above, according to the resin composition for temporary fixing according to the present embodiment, since peeling from the organic substrate can be satisfactorily carried out, and the temporary fixing material from the organic substrate can be suppressed from remaining, it is possible to omit the cleaning process.

According to the present embodiment, a semiconductor chip-packaged substrate 55 having a semiconductor chip packaged and sealed thereon is further singularized into semiconductor elements 60 by dicing (FIG. 5(*f*) and FIG. 5(*g*)).

FIG. 5(*h*) is a cross-sectional view schematically illustrating an electronic device 100 produced through the above-described processes. The electronic device 100 has a plurality of semiconductor elements 60 are disposed on a wiring board 70 by means of solder balls 65.

Thus, embodiments of the present disclosure have been described; however, the present disclosure is not necessarily limited to the above-mentioned embodiments, and modifications may be appropriately made to the extent that does not depart from the purport of the present disclosure.

EXAMPLES

Hereinafter, the present disclosure will be more specifically described by way of Examples and Comparative Examples; however, the present disclosure is not intended to be limited to the following Examples.

[Synthesis of Acrylic Rubber K-1]

In a 500-cc separable flask equipped with a stirrer, a thermometer, a nitrogen purging device (nitrogen inflow tube), and a reflux condenser with a water receptor, 200 g of deionized water, 70 g of butyl acrylate, 10 g of methyl methacrylate, 10 g of 2-hydroxyethyl methacrylate, 10 g of glycidyl methacrylate, 1.94 g of a 1.8% aqueous solution of polyvinyl alcohol, 0.2 g of lauryl peroxide, and 0.06 g of n-octylmercaptan were blended. Subsequently, $N_2$ gas was blown into the flask over 60 minutes to remove air in the system, subsequently the temperature inside the system was raised to 65° C., and then polymerization was performed for 5 hours. Furthermore, the temperature inside the system was raised to 90° C., subsequently stirring was continued for 2 hours, and polymerization was completed. Transparent beads obtained by the polymerization reaction were separated by filtration, cleaned with deionized water, and dried in a vacuum dryer at 50° C. for 6 hours, and acrylic rubber K-1 was obtained.

The weight average molecular weight of the acrylic rubber K-1 was measured by GPC, and the weight average molecular weight was 400,000 as calculated relative to polystyrene standards. Furthermore, the Tg of the acrylic rubber K-1 was −28° C.

Examples 1 to 4 and Comparative Examples 1 to 3

[Production of Support Tape for Substrate Conveyance]

Varnishes for forming a temporary fixing material layer were each prepared at the compositions in parts by mass as indicated in Table 1. Each of the prepared vanishes was applied on a polyimide film (manufactured by DuPont Toray Co., Ltd., trade name: 100EN, thickness 25 μm) as a support film, and the varnish was dried by heating for 5 minutes at 90° C. and for 5 minutes at 120° C. to form a temporary fixing material layer having a thickness of 60 μm. Subsequently, a protective film was stuck onto the temporary fixing material layer, and a support tape for substrate conveyance having a configuration of a support film, a temporary fixing material layer, and a protective film was obtained.

Y10SV-AH1: Vinylsilane surface-treated silica filler (manufactured by Admatechs Co., Ltd., trade name, average particle size 10 nm)

YA050C-MJC: Epoxysilane surface-treated silica filler (manufactured by Admatechs Co., Ltd., trade name, average particle size 50 nm)

SC2050-HNK: Phenylaminosilane surface-treated silica filler (manufactured by Admatechs Co., Ltd., trade name, average particle size 500 nm)

(Curing Accelerator)

2PZ-CN: Imidazole-based curing accelerator (manufactured by Shikoku Chemicals Corp., trade name)

For the produced support tapes for substrate conveyance of Examples and Comparative Examples, the elastic modulus after heating, the 90° peel strength after heating, the presence or absence of peeling during reflow, and peelability after reflow were evaluated by the methods described below. The evaluation results are presented in Table 2.

[Measurement of Elastic Modulus after Heating]

The elastic modulus was measured by the following procedure. First, four sheets of a temporary fixing material layer having a thickness of 60 μm were laminated at 80° C. to produce a film having a thickness of 240 μm. This was

TABLE 1

| | | Example 1 | Example 2 | Example 3 | Example 4 | Comparative Example 1 | Comparative Example 2 | Comparative Example 3 |
|---|---|---|---|---|---|---|---|---|
| Thermoplastic resin | Acrylic rubber K-1 | 55.63 | 55.63 | 55.63 | 55.63 | 55.63 | 55.63 | 55.63 |
| Thermosetting resin | EXA830-CRP | 4 | 4 | 4 | 4 | 4 | 4 | 4 |
| | YDCN-700-10 | 9.27 | 9.27 | 9.27 | 9.27 | 9.27 | 9.27 | 9.27 |
| Curing agent | HE100C-30 | 10.14 | 10.14 | 10.14 | 10.14 | 10.14 | 10.14 | 10.14 |
| Inorganic filler | YA050C-HHG | 20 | 40 | — | — | — | — | — |
| | SC2050-HLG | — | — | 20 | — | — | — | — |
| | Y10SV-AH1 | — | — | — | 20 | — | — | — |
| | YA050C-MJC | — | — | — | — | — | 20 | — |
| | SC2050-HNK | — | — | — | — | — | — | 20 |
| Curing accelerator | 2PZ-CN | 0.02 | 0.02 | 0.02 | 0.02 | 0.02 | 0.02 | 0.02 |
| Non-volatile fraction (% by mass) | | 35 | 35 | 35 | 35 | 35 | 35 | 35 |
| Solvent: Cyclohexanone | | | | | | | | |

The details of each of the components described in Table 1 are as follows.

(Thermoplastic Resin)

Acrylic rubber K-1: Acrylic rubber synthesized as described above (weight average molecular weight determined by GPC: 400,000, glycidyl methacrylate 10% by mass, Tg−28° C.)

(Thermosetting Resin)

EXA-830CRP: Bisphenol F type epoxy resin (manufactured by DIC Corp., trade name)

YDCN-700-10: Cresol novolac type polyfunctional epoxy resin (manufactured by Nippon Steel & Sumikin Chemical Co., Ltd., trade name)

(Curing Agent)

HE100-30: Phenol aralkyl resin (manufactured by Air Water, Inc., trade name)

(Inorganic Filler)

YA050C-HHG: Vinylsilane surface-treated silica filler (manufactured by Admatechs Co., Ltd., trade name, average particle size 50 nm)

SC2050-HLG: Epoxysilane surface-treated silica filler (manufactured by Admatechs Co., Ltd., trade name, average particle size 500 nm)

heated for 30 minutes in an oven at 130° C. and for 2 hours at 170° C. and then was cut out into a size of 4 mm width and 33 mm length in the thickness direction. The cut film was mounted on a dynamic viscoelasticity apparatus (trade name: Rheogel-E4000, manufactured by UMB), a tensile load was applied thereto, the elastic modulus was measured at a frequency of 10 Hz and a rate of temperature increase of 5° C./min, and the measured value at 25° C. was recorded.

[Measurement of 90° Peel Strength after Heating]

The 90° peel strength between the organic substrate and the temporary fixing material layer and the 90° peel strength between the support film and the temporary fixing material layer were evaluated by the following method. An organic substrate (material: glass epoxy substrate) having a thickness of 1000 μm and having a surface of solder resist AUS308 (manufactured by Taiyo Ink Manufacturing Co., Ltd., trade name: PSR-4000 AUS308) was placed on a stage of a roll laminator (manufactured by Taisei Laminator Co., Ltd., VA-400III), and a support tape for substrate conveyance, from which the protective film had been peeled off, was laminated thereon at a temperature of 100° C., a pressure of 0.4 MPa, and a rate of 0.15 m/min such that the temporary fixing material layer was stuck to the organic substrate side. The obtained sample was heated for 30 minutes at 130° C. and subsequently heated for 2 hours at 170° C., and then the sample was cut out into a size of 10 mm in width to obtain a film for measurement. The film for measurement was subjected to a peeling test with a peeling testing machine set up so as to have a peeling angle of 90°, at a rate of 300 mm/min, and the peel strength at that time was designated as 90° peel strength. Regarding the peel strength, the strength at the time of peeling off the temporary fixing material layer from the organic substrate (organic substrate/temporary fixing material layer 90° peel strength) and the strength at the time of peeling off the support film from the ambient temporary fixing material layer (support film/temporary fixing material layer 90° peel strength) were respectively measured.

[Evaluation of Presence or Absence of Peeling During Reflow]

The same sample as that used for the measurement of the 90° peel strength was prepared. This sample was left to stand (moisture absorption treatment) for 72 hours under the conditions of a temperature 30° C. and a humidity of 55% RH, and then was placed for 2 minutes on a hot plate heated to 260° C. such that the support film was in contact with the hot plate, and then it was visually checked whether peeling (foaming) would occur between the organic substrate and the support film (that is, between the organic substrate and the temporary fixing material layer, and/or between the support film and the temporary fixing material layer). Then, the peeling state during reflow was evaluated based on the following evaluation criteria.

A: Peeling (foaming) did not occur both between the organic substrate and the temporary fixing material layer, and between the support film and the temporary fixing material layer.

B: Slight peeling (foaming) occurred in at least one of between the organic substrate and the temporary fixing material, and between the support film and the temporary fixing material layer, and the area of the peeled (foamed) portion was 2% or less of the total area.

C: Peeling (foaming) occurred in at least one of between the organic substrate and the temporary fixing material layer, and between the support film and the temporary fixing material layer, and the area of the peeled (foamed) portion was more than 2% of the total area.

[Evaluation of Peelability after Reflow]

The same sample as that used for the measurement of the 90° peel strength was prepared. This sample was placed for 2 minutes on a hot plate heated to 260° C. such that the organic substrate was in contact with the hot plate. The sample was cooled to room temperature (25° C.), subsequently the support film was peeled off from the organic substrate, and it was visually checked whether the temporary fixing material layer stuck to the organic substrate and remained thereon. Then, the peelability after reflow was evaluated based on the following evaluation criteria.

A: The temporary fixing material layer did not remain on the organic substrate.

B: The temporary fixing material layer partially remained on the organic substrate.

C: Peeling occurred between the support film and the temporary fixing material layer, and most of the temporary fixing material layer remained on the organic substrate.

TABLE 2

|  | Example 1 | Example 2 | Example 3 | Example 4 | Comparative Example 1 | Comparative Example 2 | Comparative Example 3 |
|---|---|---|---|---|---|---|---|
| Elastic modulus after heating (MPa) | 440 | 447 | 471 | 397 | 302 | 578 | 573 |
| Organic substrate/temporary fixing material layer 90° peel strength (N/m) | 75 | 70 | 50 | 73 | 85 | 141 | 80 |
| Support film/temporary fixing material layer 90° peel strength (N/m) | 140 | 220 | 150 | 148 | 115 | 117 | 116 |
| Presence or absence of peeling during reflow | B | A | A | A | C | C | C |
| Peelability after reflow | A | A | A | A | C | C | C |

As is obvious from the results presented in Table 2, it was verified that according to the support tapes for substrate conveyance of Examples, each of the support tapes including a temporary fixing material layer which contains a thermoplastic resin, a thermosetting resin, and an inorganic filler and which has an elastic modulus of 350 to 550 MPa at 25° C. after being heated for 30 minutes at 130° C. and for 2 hours at 170° C., peeling between the support film and the organic substrate during reflow can be suppressed, and excellent peelability of the temporary fixing material layer from the organic substrate after reflow can be obtained.

REFERENCE SIGNS LIST 1, 1a, 1b: support film, 2A, 2B, 2C: temporary fixing material layer, 2a: first resin layer, 2b: second resin layer, 3: protective film, 10, 20: support tape, 15: laminated body, 30: organic substrate, 40: semiconductor chip, 50: sealant, 55: semiconductor chip-packaged substrate, 60: semiconductor element, 65: solder ball, 70: wiring board, 100: electronic device.

The invention claimed is:

1. A resin composition for temporary fixing of a support for substrate conveyance to an organic substrate,
the resin composition comprising a thermoplastic resin, a thermosetting resin, and an inorganic filler having an organic group located on a surface of the inorganic filler,
wherein the organic group comprises a vinyl group or an epoxy group, and
wherein an elastic modulus for a cured product of the resin composition is from 350 to 550 MPa at 25° C. after being heated for 30 minutes at 130° C. and for 2 hours at 170° C.

2. The resin composition according to claim 1, further comprising a curing accelerator.

3. The resin composition according to claim 1, further comprising a silicone compound.

4. The resin composition according to claim 1, wherein a content of the inorganic filler is from 20 to 100 parts by mass with respect to 100 parts by mass of the thermoplastic resin.

5. A support tape for substrate conveyance, comprising:
a support film for conveying the organic substrate; and
a temporary fixing material layer provided on the support film for temporarily fixing the organic substrate and the support film,
wherein the temporary fixing material layer is formed from the resin composition according to claim 1.

6. The support tape according to claim 5, wherein the support film is a polyethylene terephthalate film, a polybutylene terephthalate film, a polyethylene naphthalate film, a polypropylene film, a polyamide film, or a polyimide film.

7. The support tape according to claim 5, wherein after the support tape is heated for 30 minutes at 130° C. and for 2 hours at 170° C., a 90° peel strength at 25° C. between the support film and the temporary fixing material layer is 80 to 400 N/m.

8. A method for producing an electronic device, the method comprising:
forming a laminated body including a temporary fixing material interposed between the support and the organic substrate;
heating the temporary fixing material of the laminated body;
mounting a semiconductor chip on the organic substrate of the laminated body after said heating the temporary fixing material;
sealing the semiconductor chip mounted on the organic substrate with a sealant; and
peeling the support and the temporary fixing material from the organic substrate of the laminated body after said sealing the semiconductor chip,
wherein the temporary fixing material is formed from the resin composition according to claim 1.

9. The method according to claim 8, wherein a thickness of the organic substrate is 200 μm or less.

10. The method according to claim 8, wherein the organic substrate is a coreless substrate.

11. The method according to claim 8, wherein the support is a polyethylene terephthalate film, a polybutylene terephthalate film, a polyethylene naphthalate film, a polypropylene film, a polyamide film, or a polyimide film.

12. The method according to claim 8, wherein the support affixed to the organic substrate is in a tape form.

13. The method according to claim 8, wherein the laminated body is obtained using a support tape, the support tape comprising a support film as the support, and a temporary fixing material layer formed from the temporary fixing material provided on the support film.

14. The method according to claim 8, wherein after said heating the temporary fixing material, a 90° peel strength at 25° C. between the organic substrate and the temporary fixing material is 30 to 150 N/m.

15. The method according to claim 8, wherein after said heating the temporary fixing material, a 90° peel strength at 25° C. between the support and the temporary fixing material is 80 to 400 N/m.

16. The resin composition according to claim 1, further comprising a phenol aralkyl resin that is a curing agent for the thermosetting resin.

17. The resin composition according to claim 1, wherein a content of the thermoplastic resin is from 35 to 80 parts by mass with respect to 100 parts by mass of the total amount of the resin composition, a content of the thermosetting resin is from 10 to 500 parts by mass with respect to 100 parts by mass of the thermoplastic resin, and a content of the inorganic filler is from 20 to 300 parts by mass with respect to 100 parts by mass of the thermoplastic resin.

18. A heat-treated film comprising a resin composition for temporary fixing of a support for substrate conveyance to an organic substrate,
wherein the resin composition comprises a thermoplastic resin, a thermosetting resin, and an inorganic filler having an organic group located on a surface of the inorganic filler,
wherein the organic group comprises a vinyl group or an epoxy group, and
wherein the heat-treated film has an elastic modulus of 350 to 550 MPa at 25° C.

19. The heat-treated film according to claim 18, wherein when the heat-treated film is adhered to a substrate having a surface of solder resist AUS308, a 90° peel strength at 25° C. between the heat-treated film and the substrate is from 30 to 150 N/m.

20. The heat-treated film according to claim 18, wherein when the heat-treated film is adhered to a polyimide film, a 90° peel strength at 25° C. between the heat-treated film and the polyimide film is from 80 to 400 N/m.

* * * * *